United States Patent
Hsu et al.

(10) Patent No.: US 7,939,396 B2
(45) Date of Patent: May 10, 2011

(54) BASE OXIDE ENGINEERING FOR HIGH-K GATE STACKS

(75) Inventors: Peng-Fu Hsu, Hsinchu (TW); Jin Ying, Singapore (SG); Hun-Jan Tao, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 928 days.

(21) Appl. No.: 11/450,204

(22) Filed: Jun. 9, 2006

(65) Prior Publication Data

US 2007/0287199 A1    Dec. 13, 2007

(51) Int. Cl.
*H01L 21/336* (2006.01)

(52) U.S. Cl. ........................... 438/197; 438/151

(58) Field of Classification Search ............ 438/151, 438/197
See application file for complete search history.

(56) References Cited

U.S. PATENT DOCUMENTS

| | | | |
|---|---|---|---|
| 6,100,120 A | 8/2000 | Yu | |
| 6,245,311 B1 | 6/2001 | Kobayashi et al. | |
| 2004/0089902 A1* | 5/2004 | Hayakawa | 257/412 |
| 2004/0108575 A1 | 6/2004 | Ohmi et al. | |
| 2004/0266117 A1 | 12/2004 | Hwang | |
| 2006/0138538 A1* | 6/2006 | Ohmi et al. | 257/341 |
| 2007/0049051 A1* | 3/2007 | Ahn et al. | 438/778 |

OTHER PUBLICATIONS

Hou, Y.T., et al., "High Performance Tantalum Carbide Metal Gate Stack for nMOSFET Application", IEDM Tech. Dig., 4 pages (2005).
Chang, V.S., et al., "Modeling and Engineering of Hafnium Silicate (HfSiO) Gate Dielectric Deposited by Nano-Laminated Atomic Layer Deposition (NL-ALD)", in press, ECS Transaction, vol. 1, 11 pages (2006).
Hsu, P.F., et al., "Advanced Dual Metal Gate MOSFETs with High-k Dielectric for CMOS Application", VLSI Symp. Tech. Dig., 2 pages (2006).

* cited by examiner

*Primary Examiner* — N Drew Richards
*Assistant Examiner* — Jae Lee
(74) *Attorney, Agent, or Firm* — Slater & Matsil, L.L.P.

(57) ABSTRACT

A method of forming a semiconductor structure includes providing a semiconductor substrate, performing a hydrogen annealing to the semiconductor substrate, forming a base oxide layer after the step of hydrogen annealing, and forming a high-k dielectric layer on the base oxide layer.

20 Claims, 5 Drawing Sheets

US 7,939,396 B2

BASE OXIDE ENGINEERING FOR HIGH-K GATE STACKS

TECHNICAL FIELD

This invention is related generally to semiconductor devices, and more particularly to the structure and manufacturing methods of metal-oxide-semiconductor (MOS) devices.

BACKGROUND

With the scaling of integrated circuits, applications require an increasingly faster speed. This puts a requirement on the metal-oxide-semiconductor (MOS) devices, demanding that the MOS devices switch faster. As is known in the art, to increase the speed of MOS devices, high dielectric constant values (k values) of the gate dielectrics are desired. Since conventional silicon oxide, which has a k value of about 3.9, cannot satisfy such a requirement, high-k dielectric materials, which include oxides, nitrides, and oxynitrides, are increasingly used.

High-k dielectric materials, however, have high trap densities, and thus cannot be used close to the channel regions of the MOS devices. A stacked gate dielectric scheme has been introduced to accommodate the benefit of the high-k materials and conventional oxides that have low trap densities. Typically, a base oxide layer is formed on the channel region, followed by the formation of a high-k material on the base oxide layer. The stacked layers function as a gate dielectric layer.

A shortcoming with the existing stacked gate dielectric layer is the reduction of effective oxide thickness (EOT). In a conventional base oxide formation process, diluted HF is used for removing native oxide on the surface of the semiconductor substrate. Standard clean processes, which typically include a standard clean process 1 and a standard clean process 2, can also be used for cleaning the surface of the substrate. A native oxide may then be formed on the clean surface of the substrate. Using this method, the thickness of the base oxide layer can be lowered to between about 9 Å and about 10 Å. The effective oxide thickness (EOT) of the stacked layer, which includes the EOT of the base oxide layer and about 30 Å of a high-k dielectric layer, may be lowered to about 14 Å and about 15 Å accordingly. Further lowering of the EOT of the gate dielectric, however, has been limited, mainly due to the thickness of the base oxide layer. This is because although reducing the thickness of the base oxide layer can cause the reduction of the EOT, as is commonly perceived, further reduction of the thickness of the base oxide is not feasible. One of the reasons is that the surface condition of the traditionally formed oxides is thickness dependent, and the surface condition affects the quality of the subsequently formed high-k film. A base oxide layer typically needs to have a certain thickness in order to have a substantially smooth surface.

Accordingly, what is needed in the art is a MOS device that may incorporate a stacked gate dielectric layer to take advantage of the benefits associated with both a high-k dielectric and a base oxide layer while at the same time overcoming the deficiencies of the prior art.

SUMMARY OF THE INVENTION

In accordance with one aspect of the present invention, a method of forming a semiconductor structure includes providing a semiconductor substrate, performing a hydrogen annealing to the semiconductor substrate, forming a base oxide layer after the step of hydrogen annealing, and forming a high-k dielectric layer on the base oxide layer.

In accordance with another aspect of the present invention, a method of forming a semiconductor structure includes providing a silicon-containing substrate and forming a gate dielectric. The step of forming the gate dielectric includes performing a hydrogen annealing to the silicon-containing substrate at a high temperature, forming a base oxide layer on the silicon-containing substrate using a solution having de-ionized water and ozone after the step of performing the hydrogen annealing, and forming a high-k dielectric layer on the base oxide layer at a temperature of lower than about 500° C. The method further includes patterning the base oxide layer and the high-k dielectric layer to form a gate dielectric, forming a gate electrode over the gate dielectric, and forming a source/drain region adjacent the gate electrode and the gate dielectric.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

A novel metal-oxide-semiconductor (MOS) device having a stacked gate dielectric layer and methods for forming the same are provided by the present invention. The intermediate stages of manufacturing a preferred embodiment of the present invention are illustrated. Throughout the various views and illustrative embodiments of the present invention, like reference numbers are used to designate like elements.

Figure 1:
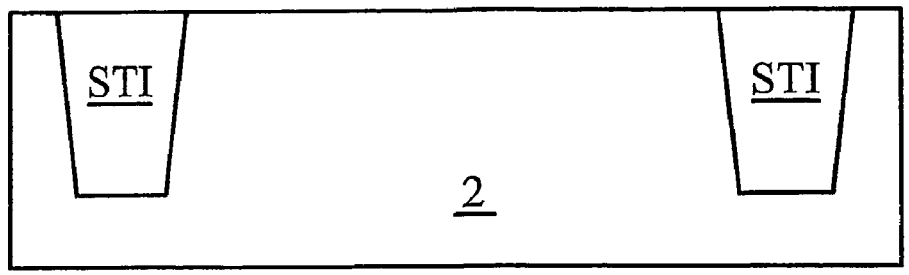
FIGS. 1-6 and 7-9 are cross-sectional views of intermediate stages in the manufacture of a MOS device embodiment.

Referring to FIG. 1, a substrate 2, which is preferably a silicon substrate, is provided. Substrate 2 may also comprise other silicon-containing semiconductor materials such as SiGe. In addition, substrate 2 may be in the form of bulk semiconductor, strained semiconductor, compound semiconductor, semiconductor on insulator (SOI), and the like. Shallow trench isolation (STI) regions are formed in the substrate 2, preferably by etching shallow trenches in the substrate 2 and filling the trenches with an insulator such as silicon oxide.

Optionally, a standard cleaning process is performed. As is known in the art, the standard cleaning process consists of two steps. The first step, which is often referred to as standard clean 1 or SC1, consists of an immersion of substrate 2 in a bath of $NH_4OH/H_2O_2/H_2O$ for, for example, about 10 minutes. This step is mainly aimed at removing particles and organic contamination. The second step, which is often referred to as standard clean 2 or SC2, uses a mixture of $HCl/H_2O_2/H_2O$ for, for example, about 10 minutes. This step primarily is aimed at removing metallic contamination. In alternative embodiments, native oxide can optionally be removed, for example, using diluted hydrofluoric acid (DHF).

A high temperature hydrogen anneal is then performed. In the preferred embodiment, the hydrogen anneal is performed in a hydrogen-containing ambient, which preferably contains substantially pure hydrogen. However, other gases, such as $N_2$, $H_2$, $D_2$, $NH_3$, and combinations thereof, can also be included. The preferred gas pressure is between about 1 torr and about 100 torr, and more preferably between about 1 torr and about 5 torr. The annealing temperature is preferably between about 600° C. and 1000° C., and more preferably between about 600° C. and about 800° C. The duration of the annealing depends on the method of annealing, and is preferably between about one minute and about five minutes. In an exemplary embodiment, a hydrogen anneal is performed at a pressure of about 100 torr, and at a temperature of about 800° C. The duration is about one minute. The preferred annealing method is thermal annealing, however, other commonly used annealing methods such as flash annealing and laser annealing can also be used. Alternatively, plasma may be provided to assist in the annealing process.

During hydrogen annealing, with the help of the energy provided by a high temperature, oxygen atoms form $H_2O$ with hydrogen. An exemplary reaction formula may be shown as:

$$2H_2 + SiO_2 \rightarrow 2H_2O + Si. \quad [\text{Eq. 1}]$$

This reaction converts the native silicon oxide, if any, on the surface of the substrate 2 into silicon. This has the equivalent effect of removing the surface silicon oxide.

Figure 2:
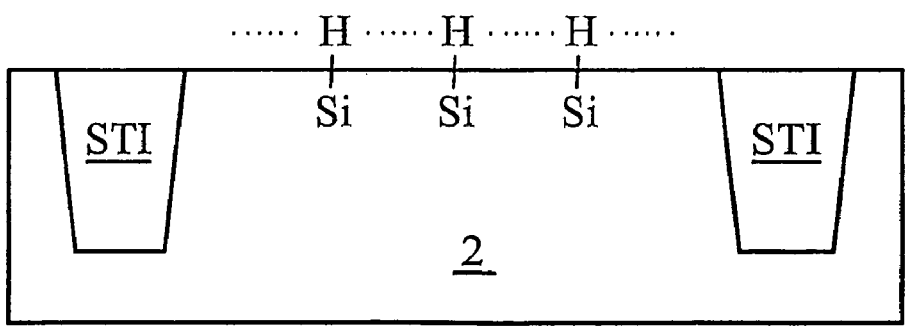

Furthermore, another possible effect of the hydrogen anneal is the formation of Si—H terminals. It should be appreciated that the mechanism behind the hydrogen anneal is not fully understood, and thus the possible mechanism discussed in the description should not be used to limit the scope of the present invention. FIG. 2 schematically illustrates the formation of bonds between silicon and hydrogen atoms. At the high temperature provided by the annealing process, hydrogen atoms may form bonds, also referred to as Si—H terminals, with silicon atoms at the surface of the substrate 2.

Figure 3:
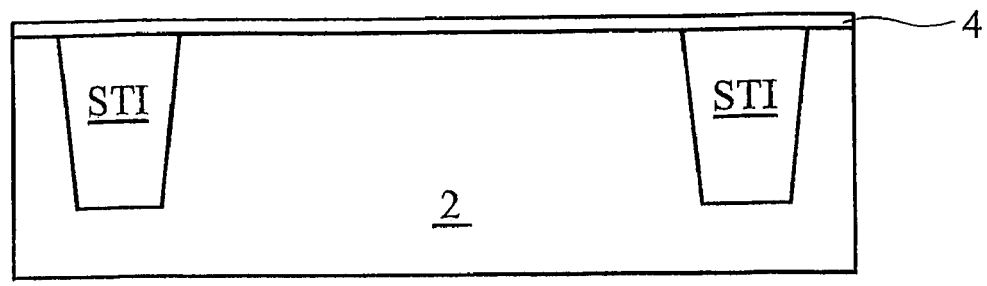

A Si—H rich surface is a desirable feature, and is favorable for the subsequent formation of hydroxyl group terminals (OH). Referring to FIG. 3, a base oxide layer 4 is formed. Preferably, between the step of hydrogen annealing and the step of forming the base oxide layer 4, substrate 2 is kept away from oxygen, water, and/or other oxygen-containing materials, so that no native oxide is formed. In the preferred embodiment, base oxide layer 4 is formed by submerging substrate 2 into a solution, which contains de-ionized water and ozone ($O_3$). Such a solution is often denoted as $DiO_3$. The $DiO_3$ solution is preferably ultra-diluted containing $O_3$ of between about 1 part per million (ppm) and about 100 ppm, and more preferably between about 1 ppm and about 10 ppm. The oxidation is preferably performed at room temperature, for example, about 25° C., although higher or lower temperatures can be used. The preferred process time is about 10 seconds to about 30 seconds.

Base oxide layer 4 preferably has a thickness of less than about 10 Å, and more preferably between about 5 Å to about 7 Å. The thickness of the base oxide layer 4 can be controlled by adjusting the process conditions such as time, temperature, etc. As is commonly perceived, given a process time, the thickness of the oxide may be affected by the process temperature. A low temperature tends to cause slower oxide formation, but the oxide quality tends to be high. The optimal process temperature and process time may be determined by routine experiments.

Figure 4:
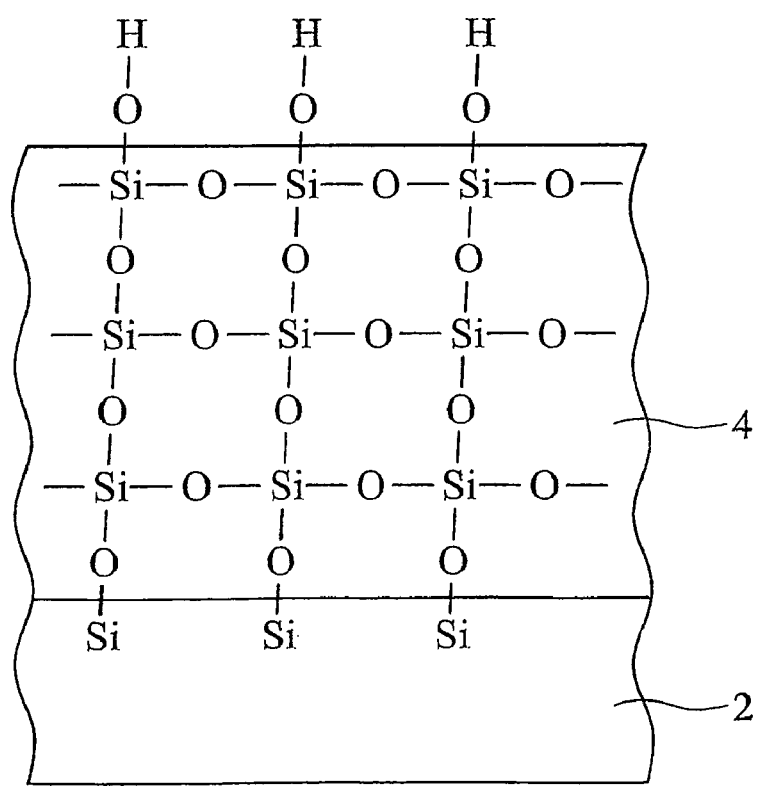

By oxidizing the surface of the substrate 2, oxygen is added to the already formed Si—H terminals and silicon substrate 2, forming silanol group elements (SiOH) with OH terminals on the surface of base oxide layer 4. FIG. 4 schematically illustrates an exemplary resulting structure. The OH terminals are formed at the surface of the base oxide layer 4. In the preferred embodiment, the base oxide layer 4 has a thickness of between about 5 Å and 7 Å, which requires several layers of a Si—O structure. With such a structure, base oxide layer 4 has improved quality with improved uniformity. The surface of the base oxide layer 4 thus has a smaller roughness.

Figure 5:
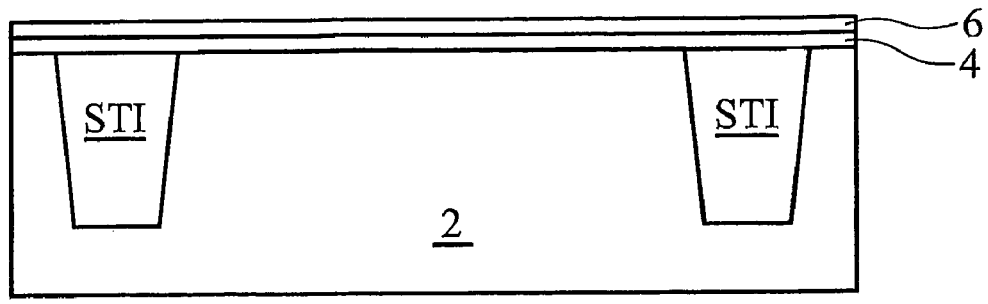

A high-k dielectric layer 6 is then formed on the base oxide layer 4, as is shown in FIG. 5. In the preferred embodiment, high-k dielectric layer 6 includes hafnium oxide ($HfO_2$). In alternative embodiments, high-k dielectric layer 6 includes other hafnium-containing materials such as $HfZrO_x$, $HfAlO_x$, $HfLaO_x$, $HfO_2$, $HfSiO_x$, $HfTiO_x$, $HfTaO_x$, $HfTiTaO_x$, and combinations thereof. In yet other embodiments, high-k dielectric layer 6 includes $LaO_3$, $ZrO_2$, $Al_2O_3$, $Ta_2O_5$, $TiO_2$, and combinations thereof. Preferably, the k value of the high-k dielectric layer 6 is greater than about 7. Conventionally, the high-k dielectric layer 6 preferably has a thickness of at least 30 Å. Otherwise, the leakage current through the high-k dielectric layer 6 may be significant. In the preferred embodiment, however, with higher quality and a more amorphous structure, the thickness of the high-k dielectric layer 6 can be 30 Å or less, or even 20 Å or less, without causing a significant leakage current. It should be appreciated that the high-k dielectric layer 6 may also have a thickness of greater than about 20 Å, or even about 30 Å or more.

The preferred formation method of high-k dielectric layer 6 is atomic layer deposition (ALD). However, other commonly used methods such as plasma enhanced chemical vapor deposition (PECVD), low-pressure chemical vapor deposition (LPCVD), metal-organic chemical vapor deposition (MOCVD), plasma enhanced atomic layer deposition (PEALD), and the like, can also be used. High-k dielectric layer 6 is preferably formed at a low temperature, for example, lower than about 500° C., and more preferably lower than about 350° C., and even more preferably lower than about 250° C. The low temperature will prevent the re-growth of the interfacial oxide layer between substrate 2 and the overlying base oxide layer 4, particularly when oxygen is preserved during the formation of high-k dielectric layer 6.

Figure 6:
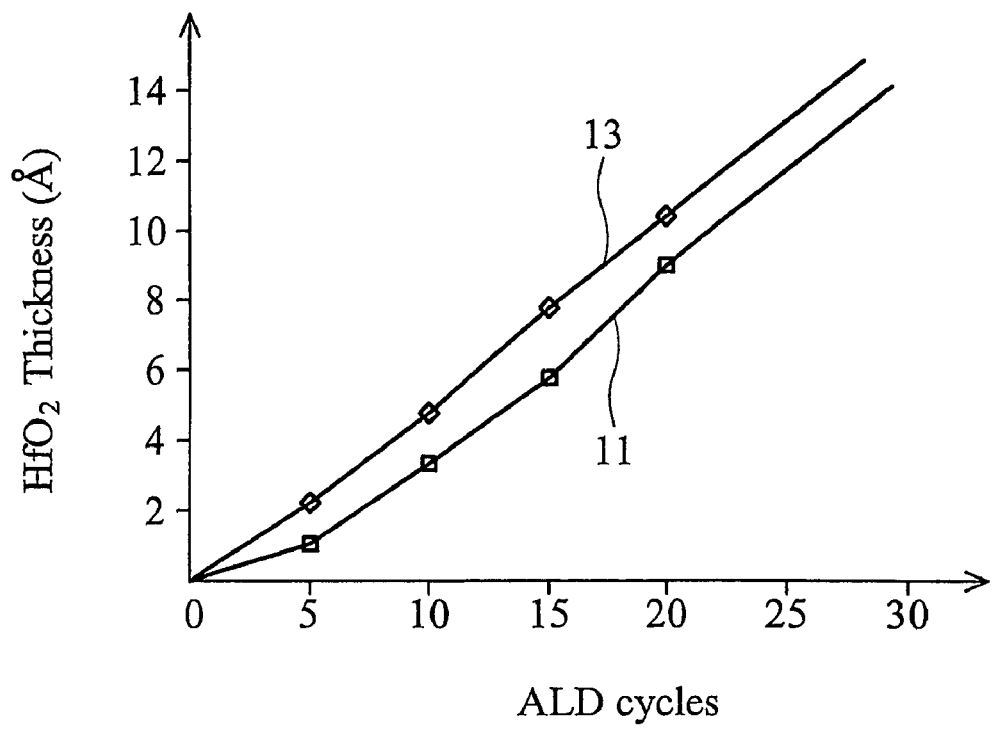

Experiments have been performed to reveal the effects of a hydrogen anneal on the formation of high-k dielectric layer 6. $HfO_2$ films are formed using ALD. The results are shown in FIG. 6, wherein the thicknesses of the $HfO_2$ films are shown as a function of ALD cycles. It has been found that without the hydrogen-annealing step, the formation of high-k dielectric layer 6 has a significant delay (line 11), which means that during an initial stage, less $HfO_2$ is grown for each cycle of ALD. The increase in the thickness becomes linear after about 20 ALD cycles. A possible consequence of the delay in the $HfO_2$ formation is that less nuclei are likely to be formed. The subsequently formed grains around the nucleus thus are bigger, which in turn causes greater roughness at the surface of the high-k dielectric layer 6. Conversely, with the hydrogen-annealing step being performed, the delay in the growth of $HfO_2$ (line 13) is significantly reduced. As a result, more nuclei are expected to be formed, and the surface roughness will be smaller.

An additional advantageous feature of the preferred embodiments is that fewer crystal structures are formed in the high-k dielectric layer 6. This may also be caused by less delay time, a greater number of nuclei, and thus smaller grain size. Consequently, high-k dielectric layer 6 has an improved amorphous structure. The improved amorphous structure has been proven by smaller threshold voltage variations in sample MOS devices formed using the preferred embodiments of the present invention. An analysis reveals that the high-k dielectric layer 6 formed with the hydrogen-annealing step is substantially continuous while the high-k dielectric layer 6 formed without the hydrogen-annealing step has noticeable islands.

In another embodiment of the present invention, after the formation of STI regions, a base oxide layer (not shown) is formed using a conventional oxide formation method, such as rapid thermal process (RTP) or in-situ steam generator (ISSG). The resulting oxide layer tends to be thicker than about 10 Å. A wet etching, for example, using a diluted HF solution, or a dry etching may then be used to partially etch back the relatively thick base oxide layer. A hydrogen anneal is then performed on the resulting base oxide layer. The process conditions for the hydrogen anneal are essentially the same as previously discussed.

Figure 7:
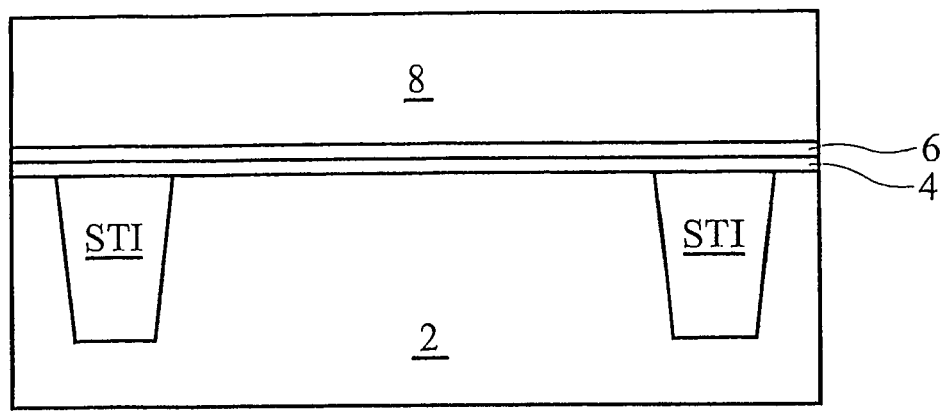

Referring to FIG. 7, a gate electrode layer 8 is formed on the high-k dielectric layer 6. As is known in the art, the gate electrode layer 8 may include polysilicon, metal, conductive metal oxide, conductive metal nitride, metal silicide, and the like.

Figure 8:
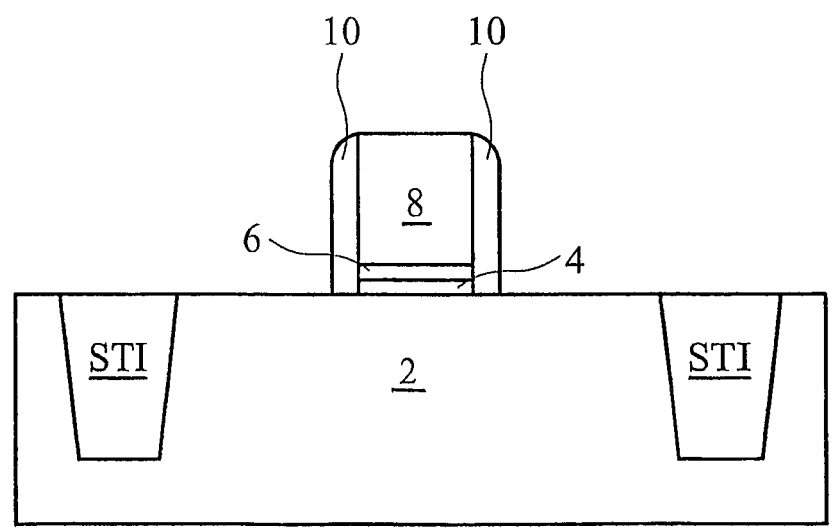
Figure 9:
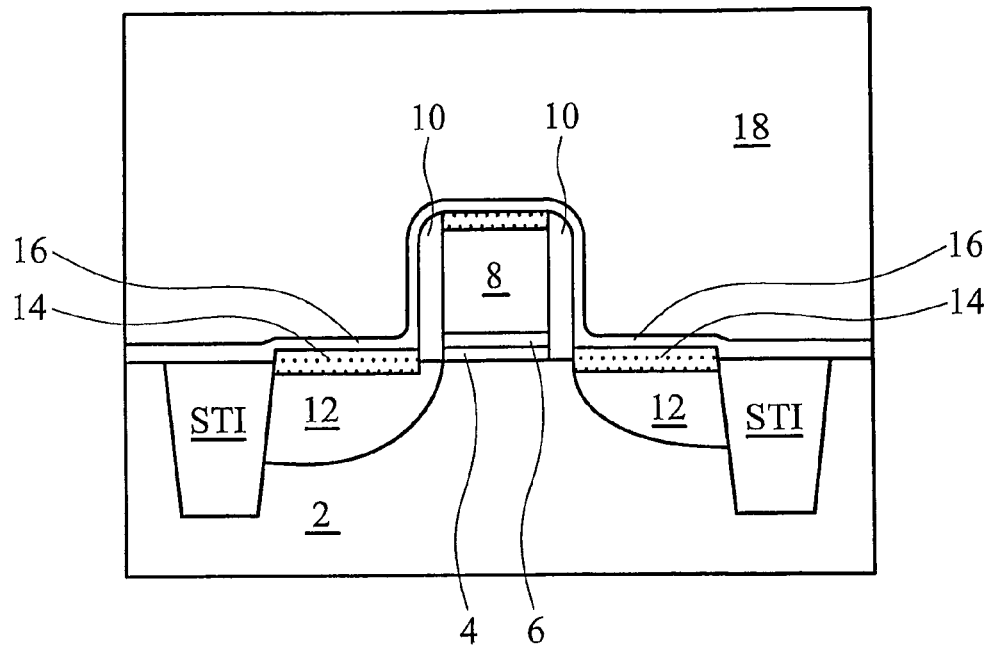

FIGS. 8 and 9 illustrate the formation of the remaining portions of a MOS device. The stacked gate structure formed in the previously discussed steps, which includes base oxide layer 4, high-k dielectric layer 6 and gate electrode layer 8, are patterned to form a gate stack, as is shown in FIG. 8. Gate spacers 10 are then formed. As is known in the art, gate spacers 10 can be formed by blanket depositing a dielectric layer, such as SiN, and then etching out undesired portions. Gate spacers 10 may also have a composite structure, for example, an oxide-nitride structure or an oxide-nitride-oxide (ONO) structure.

FIG. 9 illustrates the formation of source/drain regions 12 and silicide regions 14. In the preferred embodiment, source/drain regions 12 are formed by implanting appropriate impurities into semiconductor substrate 2. The gate spacers 10 are used as a mask during implantation so that the edges of the source/drain regions 12 are substantially aligned with the respective gate spacers 10. Source/drain regions 12 can also be formed by recessing substrate 2 and epitaxially growing semiconductor materials in the recesses. To form the silicide regions 14, a thin layer of metal (not shown), such as cobalt, nickel, erbium, molybdenum, platinum, and combinations thereof, is first formed over the device. The device is then annealed to form silicide regions 14 between the deposited metal and the underlying exposed silicon regions. The remaining metal layer is then removed. A contact etch stop layer (CESL) 16 and an inter-level dielectric layer 18 are then formed. Contact plugs (not shown) are subsequently formed. The processes of forming such are well known in the art and therefore are not repeated herein.

The preferred embodiments have several advantageous features. By using the preferred embodiment of the present invention, the equivalent oxide thickness of the gate dielectric layer has been improved. Experiments have shown that if the hydrogen annealing process is not performed, the gate dielectric comprising a 30 Å high-k dielectric layer and a 5 Å to 7 Å (DiO$_3$) base oxide layer will have a significantly higher leakage current, which may be caused by the island-growth in the base oxide layer. With the hydrogen annealing process, however, the thickness of the base oxide layer can be reduced to as small as about 5 Å to about 7 Å without causing significant leakage current. The EOT of the gate dielectric layer, which includes base oxide layer 4 and high-k dielectric layer 6, is reduced to about 12 Å.

Figure 10:
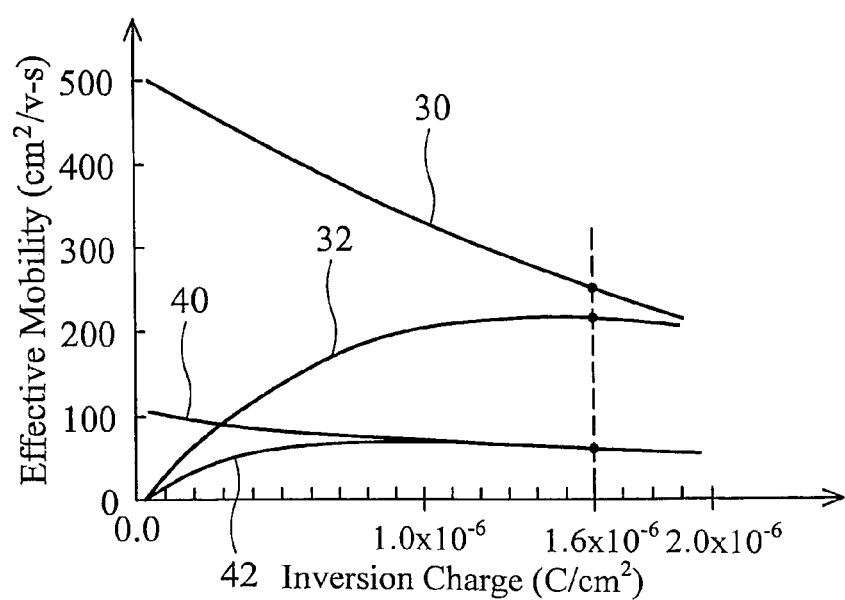
FIG. 10 illustrates the effective mobilities of carriers as a function of inversion charges, which are directly proportional to electrical fields in the channel regions of the MOS devices.

A significant improvement in carrier mobility has been observed in both PMOS devices and NMOS devices formed using the preferred embodiments of the present invention. An example is shown in FIG. 10, wherein the effective mobility of carriers in the channel region of the MOS device is shown as a function of the inversion charges, which is directly related to electric fields in the respective channel region. Line 30 is a universal curve of electron mobility in an NMOS device, which has a polysilicon gate formed on a silicon oxide gate dielectric. Line 32 indicates the carrier mobility of electrons in an NMOS device formed using the preferred embodiments. It is observed that at about $1.6 \times 10^{-6}$ C/cm$^2$, which corresponds to the operation voltage used for the experiment, the electron mobility is about 90 percent of the value of the universal curve 30, which is a significantly higher value over previously reported results. The universal curve of a PMOS device having a poly/SiO$_2$ gate structure is shown as line 40, and the hole mobility of a PMOS device formed using the preferred embodiments is shown as line 42. It is noted that holes in PMOS devices have substantially the same mobility as the poly/SiO$_2$ universal curve does. Such high mobilities are partially attributed to the improved interface quality from the H$_2$/DiO$_3$ base oxide.

Although the present invention and its advantages have been described in detail, it should be understood that various changes, substitutions and alterations can be made herein without departing from the spirit and scope of the invention as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A method of forming a semiconductor structure, the method comprising:
    providing a semiconductor substrate;
    performing a hydrogen-containing annealing to the semiconductor substrate;
    forming a base oxide layer on the semiconductor substrate after the step of hydrogen annealing, wherein the step of forming the base oxide layer is performed by submerging the semiconductor substrate in a solution comprising de-ionized water and ozone; and
    forming a high-k dielectric layer on the base oxide layer.

2. The method of claim 1, wherein the solution comprises ozone (O$_3$) of between about 1 part per million (ppm) and about 10 ppm.

3. The method of claim 1 further comprising:
    forming a gate electrode layer over the high-k dielectric layer;
    patterning the gate electrode layer to form a gate electrode;

patterning the high-k dielectric layer and the base oxide layer to form a gate dielectric; and forming a source/drain region adjacent the gate dielectric.

4. The method of claim 1, wherein the step of forming the high-k dielectric layer is performed at a temperature of lower than about 500° C.

5. The method of claim 1 further comprising performing a diluted HF cleaning before the step of performing the hydrogen-containing annealing.

6. The method of claim 1 further comprising performing a standard cleaning before the step of performing the hydrogen-containing annealing.

7. The method of claim 1, wherein the hydrogen-containing annealing is performed at a temperature of between about 600° C. and about 1000° C.

8. The method of claim 1, wherein the hydrogen-containing annealing is performed at a pressure of between about 1 torr and about 100 torr.

9. The method of claim 1, wherein the hydrogen-containing annealing has a duration of between about one minute and about five minutes.

10. The method of claim 1, wherein the high-k dielectric layer is formed using atomic layer deposition (ALD).

11. The method of claim 1, wherein the base oxide layer comprises a hafnium based oxide.

12. The method of claim 1, wherein substantially no native oxide is formed on a surface of the semiconductor substrate after the step of performing a hydrogen-containing annealing.

13. A method of forming a semiconductor structure, the method comprising:

providing a silicon-containing substrate;

forming a gate dielectric comprising:

performing a hydrogen annealing to the silicon-containing substrate;

forming a base oxide layer on the silicon-containing substrate using a solution having de-ionized water and ozone after the step of performing the hydrogen annealing; and forming a high-k dielectric layer on the base oxide layer at a temperature of lower than about 500° C.;

forming a gate electrode layer over the high-k dielectric layer;

patterning the gate electrode layer to form a gate electrode;

patterning the base oxide layer and the high-k dielectric layer to form a gate dielectric; and forming a source/drain region adjacent the gate electrode and the gate dielectric.

14. The method of claim 13, wherein between the step of performing the hydrogen annealing and the step of forming the base oxide layer, the silicon-containing substrate is exposed in only oxygen-free environments.

15. The method of claim 13, wherein the hydrogen annealing is performed after formation of shallow trench isolations.

16. The method of claim 13, wherein the solution comprises ozone ($O_3$) of between about 1 part per million (ppm) and about 10 ppm.

17. The method of claim 13, wherein the hydrogen annealing is performed at a temperature of higher than about 600° C. and at a pressure of between about 1 torr and about 100 torr.

18. The method of claim 13, wherein the base oxide layer comprises a hafnium based oxide.

19. The method of claim 13, wherein the base oxide layer has a thickness of less than about 7 Å.

20. The method of claim 13, wherein the high-k dielectric layer has a thickness of less than about 20 Å.

* * * * *